(12) United States Patent
Huber et al.

(10) Patent No.: US 12,495,570 B2
(45) Date of Patent: Dec. 9, 2025

(54) VERTICAL FIELD-EFFECT TRANSISTOR, METHOD FOR PRODUCING A VERTICAL FIELD-EFFECT TRANSISTOR AND COMPONENT HAVING VERTICAL FIELD-EFFECT TRANSISTORS

(71) Applicant: Robert Bosch GmbH, Stuttgart (DE)

(72) Inventors: Christian Huber, Ludwigsburg (DE); Jens Baringhaus, Sindelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 690 days.

(21) Appl. No.: 17/799,587

(22) PCT Filed: Feb. 15, 2021

(86) PCT No.: PCT/EP2021/053597
§ 371 (c)(1),
(2) Date: Aug. 12, 2022

(87) PCT Pub. No.: WO2021/165184
PCT Pub. Date: Aug. 26, 2021

(65) Prior Publication Data
US 2023/0065808 A1 Mar. 2, 2023

(30) Foreign Application Priority Data
Feb. 18, 2020 (DE) ..................... 10 2020 202 034.5

(51) Int. Cl.
*H01L 29/778* (2006.01)
*H01L 29/20* (2006.01)
(Continued)

(52) U.S. Cl.
CPC ............ *H10D 30/477* (2025.01); *H10D 8/60* (2025.01); *H10D 30/015* (2025.01); *H10D 62/8503* (2025.01); *H10D 64/251* (2025.01)

(58) Field of Classification Search
CPC ...... H10D 8/60; H10D 30/015; H10D 30/477; H10D 30/478; H10D 62/8503; H10D 64/251
See application file for complete search history.

(56) References Cited

U.S. PATENT DOCUMENTS 9,184,286 B2   11/2015  Nakano
12,068,375 B2 *  8/2024  Shibata .................. H10D 30/87
(Continued)

FOREIGN PATENT DOCUMENTS

CN        1328361 A    12/2001
CN      101771075 A     7/2010
(Continued)

OTHER PUBLICATIONS

Zhu et al., "Vertical GaN Power Transistor With Intrinsic Reverse Conduction and Low Gate Charge for High-Performance Power Conversion", IEEE Journal of Emerging and Selected Topics in Power Electronics, 7(3), (2019), pp. 1449-1455.
(Continued)

*Primary Examiner* — David C Spalla
(74) *Attorney, Agent, or Firm* — NORTON ROSE FULBRIGHT US LLP

(57) ABSTRACT

A vertical field-effect transistor. The vertical field-effect transistor has: A first semiconductor layer, which has a p-type conductivity, on or over a drift region; a groove structure which penetrates the first semiconductor layer vertically, the groove structure having at least one side wall on which a field-effect transistor (FET)-channel region is formed, the FET-channel region having a III-V-heterostructure for forming a two-dimensional electron gas at an interface of the III-V-heterostructure; a source-drain electrode which is electroconductively connected to the III-V-heterostructure; and a contact structure at least partially on or over the drift region, which forms a Schottky- or hetero-
(Continued)

contact at least with the drift region, the contact structure being electroconductively connected to the source-drain electrode, and at least the region lying vertically between the contact structure and the drift region being free of the first semiconductor layer.

13 Claims, 7 Drawing Sheets

(51) Int. Cl.
*H01L 29/417* (2006.01)
*H01L 29/66* (2006.01)
*H01L 29/872* (2006.01)
*H10D 8/60* (2025.01)
*H10D 30/01* (2025.01)
*H10D 30/47* (2025.01)
*H10D 62/85* (2025.01)
*H10D 64/23* (2025.01)

(56) References Cited

U.S. PATENT DOCUMENTS

| | | | | |
|---|---|---|---|---|
| 2011/0204381 | A1* | 8/2011 | Okada | H10D 30/877 257/E21.403 |
| 2012/0034810 | A1 | 2/2012 | Chiarelli | |
| 2012/0319127 | A1 | 12/2012 | Chowdhury et al. | |
| 2018/0350965 | A1 | 12/2018 | Shibata et al. | |
| 2021/0167061 | A1* | 6/2021 | Shibata | H10D 30/477 |

FOREIGN PATENT DOCUMENTS

| | | |
|---|---|---|
| CN | 102570649 A | 7/2012 |
| CN | 103035706 A | 4/2013 |
| CN | 105098417 A | 11/2015 |
| CN | 107482059 A | 12/2017 |
| DE | 102017209568 A1 | 12/2018 |
| JP | 2019047122 A | 3/2019 |
| TW | 435060 B | 5/2001 |
| WO | 2011013500 A1 | 2/2011 |
| WO | 2016147541 A1 | 9/2016 |
| WO | 2017138505 A1 | 8/2017 |

OTHER PUBLICATIONS

International Search Report for PCT/EP2021/053597, Issued May 20, 2021.

* cited by examiner

VERTICAL FIELD-EFFECT TRANSISTOR, METHOD FOR PRODUCING A VERTICAL FIELD-EFFECT TRANSISTOR AND COMPONENT HAVING VERTICAL FIELD-EFFECT TRANSISTORS

FIELD

A vertical field-effect transistor, a method for producing a vertical field-effect transistor and a component having vertical field-effect transistors are provided.

BACKGROUND INFORMATION

Figure 1:
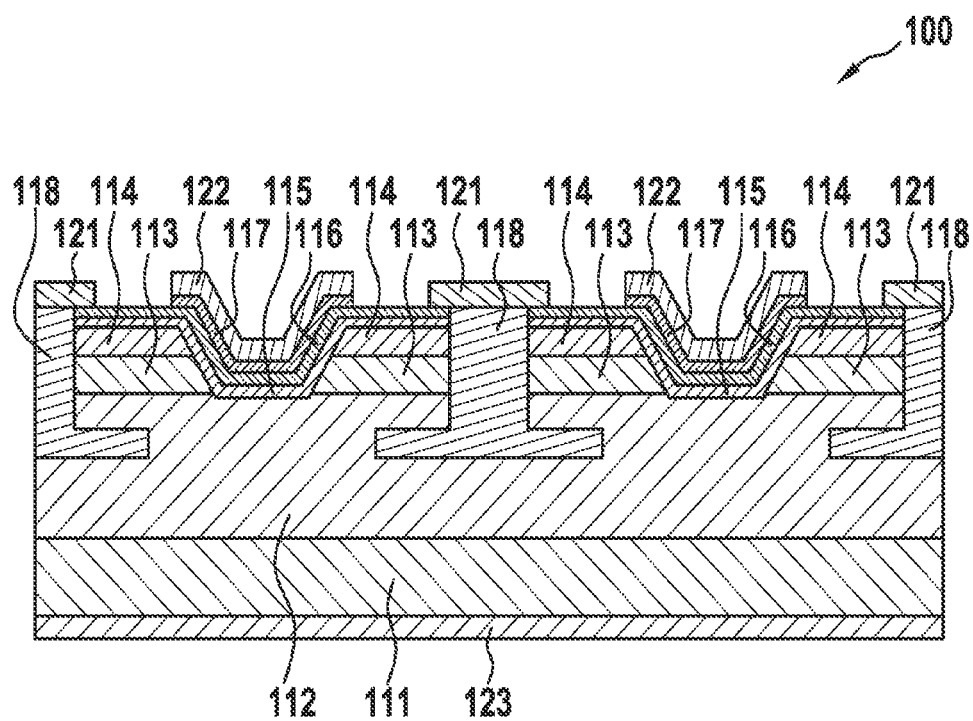

Transistors based on gallium nitride (GaN) offer the possibility of realizing components with lower ON-resistances, accompanied at the same time by higher breakdown voltages than comparable components based on silicon or silicon carbide. One possible design for such a transistor is what is referred to as the VHEMT (vertical groove high electron mobility transistor), in which the channel through a two-dimensional electron gas (2DEG) is shown at the interface of an AlGaN/GaN heterostructure, the electron gas being grown in a V-shaped groove. FIG. 1 shows an example for a conventional VHEMT transistor 100. The structure in FIG. 1 shows two transistor cells. Each transistor cell is made up of a conductive GaN-substrate 111, on which a lightly n-doped GaN-drift region 112 is applied. Located above drift region 112 is a p-doped GaN-region 113, and above that, an insulating GaN- or AlGaN-region 114. Both regions 113, 114 are penetrated by a V-shaped groove, over which an undoped GaN-region 115 as well as an ALGaN-region 116 extend. At the interface of the two regions 115, 116—but within region 115—the two-dimensional electron gas (2DEG) forms. A p-doped GaN-region 117 is incorporated in the V-shaped groove in order to ensure a normally-off operation of the transistor. A gate electrode 122 contacts p-GaN-region 117. A heavily doped p-region 118 is incorporated in drift region 112, in order to shield the gate groove with respect to the high electric fields occurring in the case of blocking. A source contact 121 contacts both the 2DEG as well as p-regions 113, 118. A drain electrode 123 is located on the back of substrate 111.

Without applying a gate voltage, transistor 100 is normally-off, since the 2DEG below p-GaN region 117 is depleted. By applying a positive voltage to gate electrode 122, the entire 2DEG becomes filled with electrons, and the electrons flow from source electrode 121 over the side wall of the gate groove into the bottom of the gate groove and from there into drift region 112, via GaN substrate 111 into drain electrode 123.

In order to use transistor 100 in inverter applications, for example, a reverse conductivity of the component becomes absolutely necessary. In the structure shown in FIG. 1, this reverse operation takes place via the so-called body diode which forms between p-region 118 and n-conducting drift region 112. Thus, in reverse operation, the electrons do not flow through the 2DEG into undoped GaN-region 115, but rather from drain electrode 123 through substrate 111, drift region 112 and p-region 118 into source electrode 121. In this sense, the body diode is connected in parallel with the transistor. Due to the high band gap of GaN, an energy barrier forms at the p-n junction, which results in a high forward voltage of the body diode of approximately 3 V. This forward voltage results in high electrical losses in the reverse operation of the transistor.

In addition, other power-transistor architectures are available which provide an additional Schottky contact for a low-loss reverse operation, see, for example, U.S. Pat. No. 9,184,286 B2 or Zhu et al. ("Vertical GaN Power Transistor with Intrinsic Reverse Conduction and Low Gate Charge for High-Performance Power Conversion" IEEE Journal of Emerging and Selected Topics in Power Electronics, Vol. 7, No. 3, DOI: 10.1109/JESTPE.2019.2903828).

SUMMARY

An object of the present invention is to provide a vertical field-effect transistor which permits lower conduction losses in reverse operation, and at the same time a normally-off vertical field-effect transistor with low sheet resistance, and to provide a method for its fabrication and a component having vertical field-effect transistors.

The objective may be achieved according to one aspect of the present invention by a vertical field-effect transistor. According to an example embodiment of the present invention, the vertical field-effect transistor has: A first semiconductor layer, which has a p-type conductivity, on or over a drift region; a groove structure which penetrates the first semiconductor layer vertically, the groove structure having at least one side wall on which a field-effect transistor (FET)-channel region is formed, the FET-channel region having a III-V-heterostructure for forming a two-dimensional charge-carrier gas, e.g., an electron gas, at an interface of the III-V-heterostructure; a source-drain electrode which is electroconductively connected to the III-V-heterostructure; and a contact structure at least partially on or over the drift region, which forms a Schottky- or hetero-contact at least with the drift region, the contact structure being electroconductively connected to the source-drain electrode, and at least the region lying vertically between the contact structure and the drift region being free of the first semiconductor layer. This permits lower conduction losses in reverse operation, and at the same time, provides a normally-off transistor with low sheet resistance. The high-loss conduction mechanism via the p-n diode is replaced illustratively by a Schottky- or hetero-diode integrated in the vertical field-effect transistor. This allows lower forward voltages than the conventional p-n junction. The conduction losses of the FET in reverse operation may thereby be reduced substantially, and consequently the efficiency of the vertical field-effect transistor may be increased. In the forward operation of the vertical field-effect transistor, the Schottky diode or hetero-diode is reverse biased and thus always blocking, so that the switching performance of the vertical field-effect transistor is not influenced.

Optionally, a second semiconductor layer, which is electrically insulating, may be formed on the first semiconductor layer. The groove structure may penetrate the first semiconductor layer and the second semiconductor layer vertically. The region lying vertically between the contact structure and the drift region may be free of the first semiconductor layer and the second semiconductor layer.

The object may be achieved according to a further aspect of the present invention by a component. According to an example embodiment of the present invention, the component has: A first vertical field-effect transistor and a second vertical field-effect transistor, each having: A first semiconductor layer, which has a p-type conductivity, on or over a drift region; a groove structure which penetrates the first semiconductor layer vertically, the groove structure having at least one side wall on which a field-effect transistor FET-channel region is formed, the FET-channel region having a III-V-heterostructure for forming a two-dimensional electron gas at an interface of the III-V-heterostructure; and a source-drain electrode which is electroconductively connected to the III-V-heterostructure, the component also having a contact structure at least partially on or over the drift region, the contact structure being formed laterally between the groove structure of the first vertical field-effect transistor and the groove structure of the second vertical field-effect transistor and being electroconductively connected to the source-drain electrode of at least one of the first and second vertical field-effect transistors, at least the region lying vertically between the contact structure and the drift region being free of the first semiconductor layer.

Optionally, the vertical field-effect transistors may have a second semiconductor layer which is electrically insulating and is formed on the first semiconductor layer. The region lying vertically between the contact structure and the drift region may be free of the first semiconductor layer and the second semiconductor layer.

According to a further aspect of the present invention, the objective may be achieved by a method for producing a vertical field-effect transistor. According to an example embodiment of the present invention, the method features: Forming a first semiconductor layer, which has a p-type conductivity, on or over a drift region; forming a groove structure which penetrates the first semiconductor layer vertically, the groove structure being formed with at least one side wall on which a field-effect transistor (FET)-channel region is formed, the FET-channel region having a III-V-heterostructure for forming a two-dimensional electron gas at an interface of the III-V-heterostructure; and forming a source-drain electrode which is electroconductively connected to the III-V-heterostructure; and forming a contact structure at least partially on or over the drift region, which forms a Schottky- or hetero-contact at least with the drift region, the contact structure being electroconductively connected to the source-drain electrode, and at least the region lying vertically between the contact structure and the drift region remaining free of the first semiconductor layer.

Optionally, a second semiconductor layer, which is electrically insulating, may be formed on the first semiconductor layer. The groove structure may penetrate the first semiconductor layer and the second semiconductor layer vertically. At least the region lying vertically between the contact structure and the drift region may be free of the first semiconductor layer and the second semiconductor layer.

Further developments of the aspects of the present invention are disclosed herein. Specific embodiments of the present invention are explained in greater detail in the following and represented in the figures.

FIG. 1 shows a schematic sectional view of a VEHMT transistor of the related technology.

FIGS. 2 to 8 each show schematic sectional views of a component having vertical field-effect transistors according to various specific example embodiments of the present invention.

Figure 9:
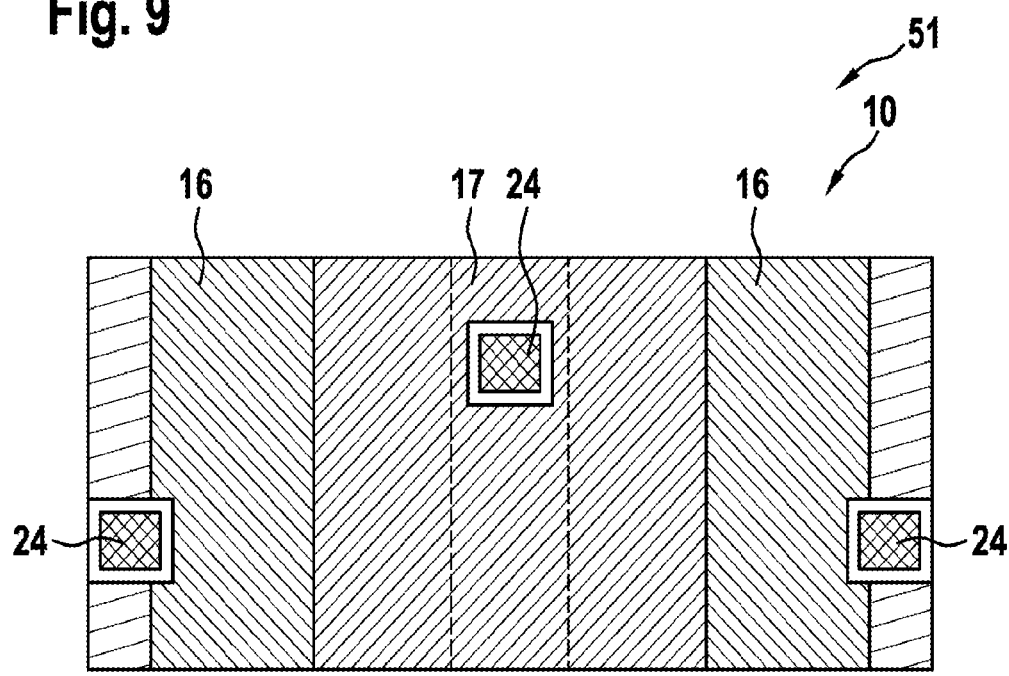
Figure 10:
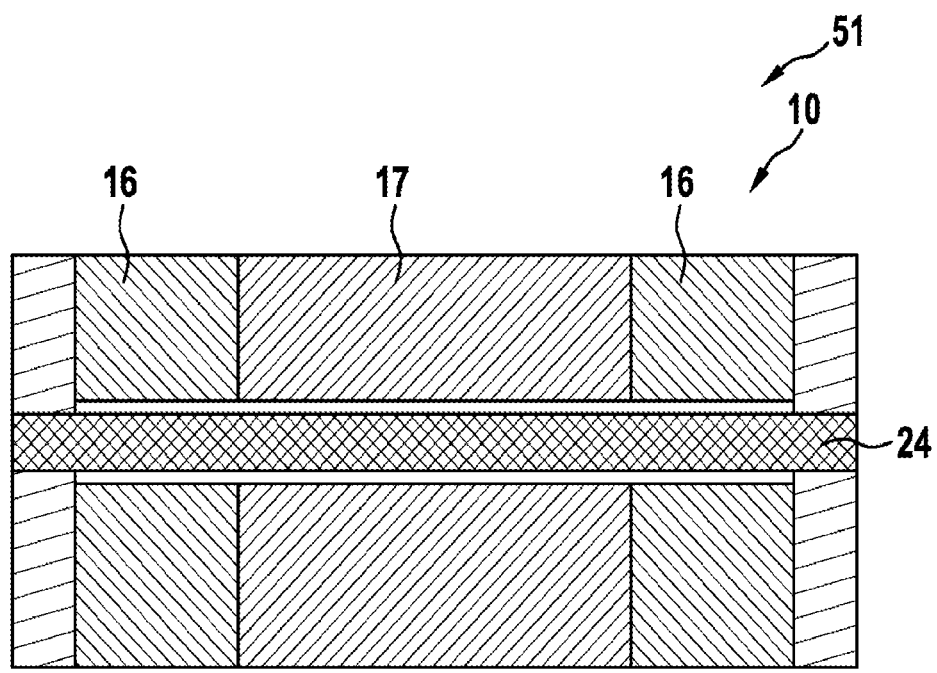

FIGS. 9 and 10 each show schematic top views of a component having vertical field-effect transistors according to various specific example embodiments of the present invention.

Figure 11:
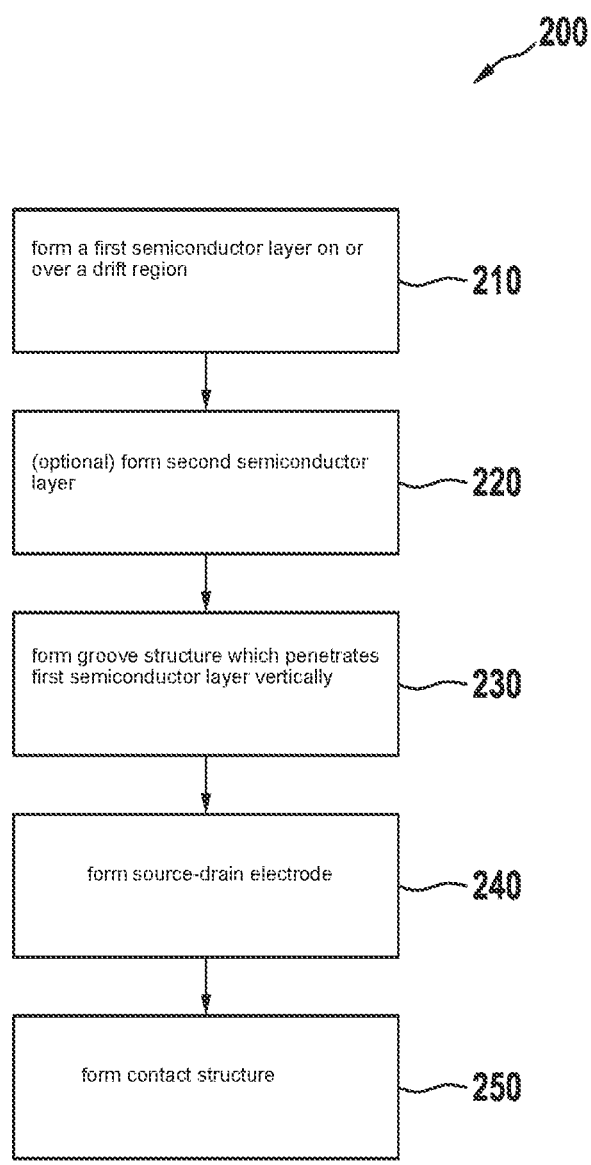

FIG. 11 shows a flowchart of a method for producing a vertical field-effect transistor according to various specific example embodiments of the present invention.

DETAILED DESCRIPTION OF EXAMPLE EMBODIMENTS

In the following detailed description, reference is made to the figures which form part of this description and in which specific exemplary embodiments in which the present invention may be exploited are shown for illustration. It should be understood that other exemplary embodiments may be used and structural or logical changes may be made without departing from the scope of the present invention. It is understood that the features of the various exemplary embodiments described herein may be combined with each other, insofar as not specifically indicated otherwise. The following detailed description is therefore not to be understood in the restrictive sense, and the scope of the present invention is defined by the attached claims. Identical or similar elements are provided with identical reference numerals in the figures, insofar as suitable.

Figure 4:
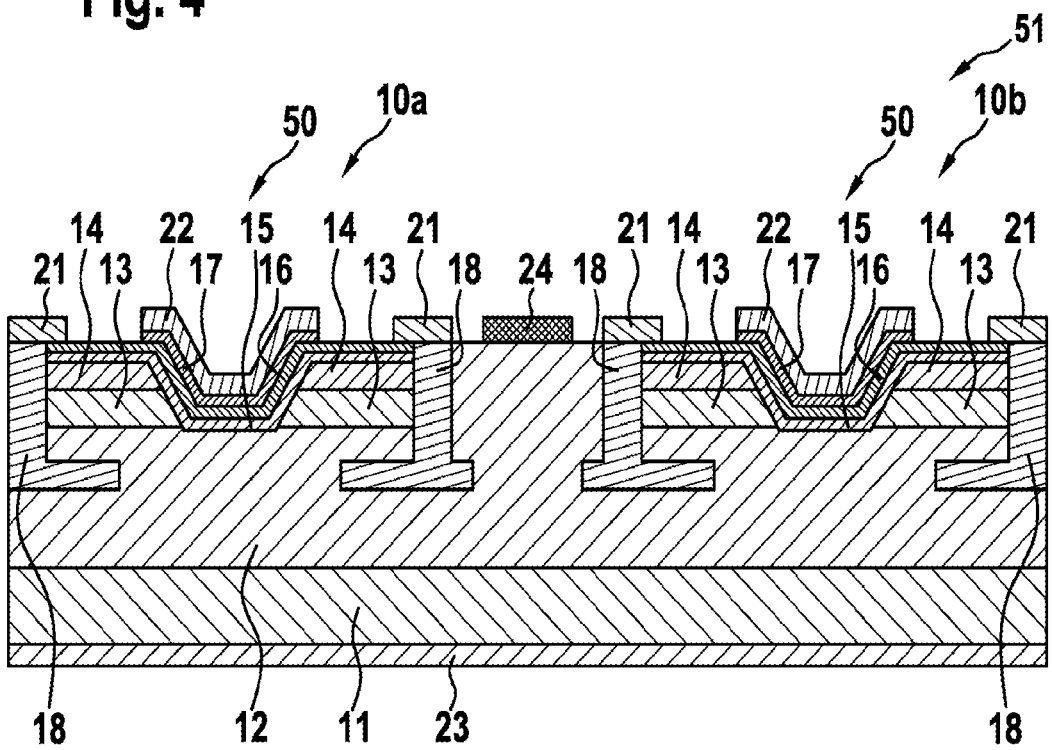
Figure 5:
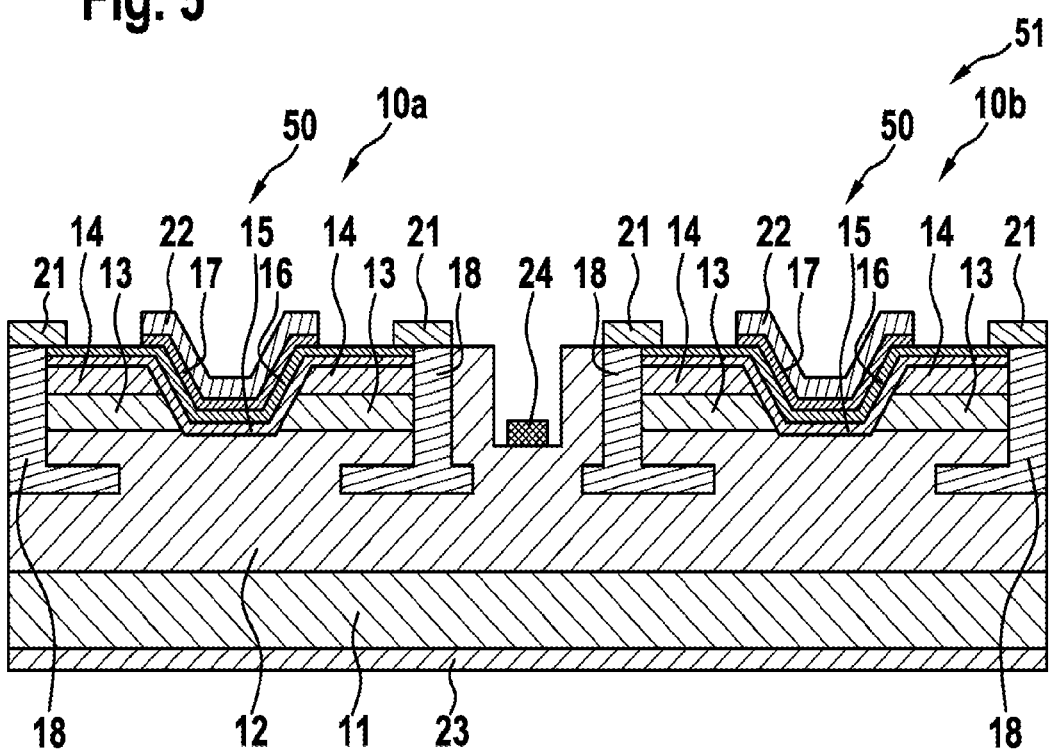
Figure 6:
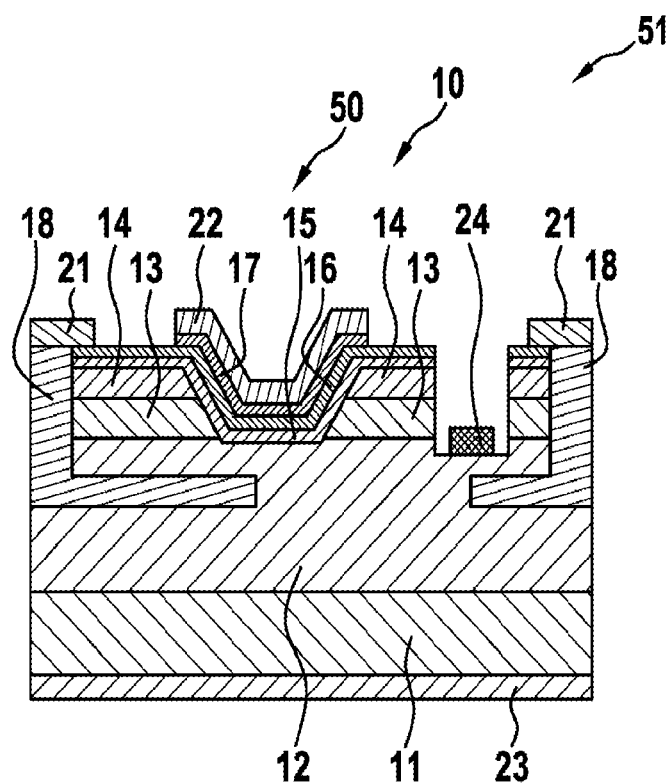

FIG. 2 to FIG. 8 each show schematic sectional views, and FIG. 9 and FIG. 10 each show schematic top views of a component 51 having vertical field-effect transistors 10, 10a, 10b according to various specific embodiments. FIG. 6, FIG. 9 and FIG. 10 each illustrate a field-effect transistor 10, and FIG. 2 to FIG. 5 and FIG. 7 to FIG. 8 each illustrate a first vertical field-effect transistor 10a and a second vertical field-effect transistor 10b. Vertical field-effect transistors 10, 10a, 10b illustrated are each individual cells of the component having at least one vertical field-effect transistor (FET cell). A two-dimensionally extended field of FET cells is formed by combinations of multiple FET cells. The vertical field-effect transistor may be a power semiconductor component.

On a semiconductor substrate 11, e.g., a GaN-substrate 11, a vertical field-effect transistor 10, 10a, 10b has a drift region 12, e.g., an n-doped GaN-drift region 12. Above drift region 12 is a first semiconductor layer 13, which has a p-type conductivity, e.g., a p-doped semiconductor layer 13. Upon first semiconductor layer 13, optionally a second semiconductor layer 14 may be formed, for example, an electrically insulating semiconductor layer 14, e.g., an electrically insulating GaN- or AlGaN-semiconductor layer 14. First and (optionally) second semiconductor layers 13, 14 are penetrated by a V-shaped groove. In the V-shaped groove, a groove structure 50 is formed which penetrates first semiconductor layer 13 and (optionally) second semiconductor layer 14 vertically. Groove structure 50 has at least one side wall, on which a field-effect transistor (FET)-channel region is formed. Groove structure 50 may have a first side wall and a second side wall which embrace a bottom. The FET-channel region has a III-V-heterostructure 15/16 for forming a two-dimensional electron gas at an interface of III-V-heterostructure 15/16. For example, III-V-heterostructure 15/16 has an undoped GaN-layer 15 as well as an AlGaN-layer 16. At the interface of the two layers 15, 16—but within layer 15—the two-dimensional electron gas (2DEG) forms. In addition, a p-doped GaN-layer 17 is formed in the V-shaped groove in order to ensure a normally-off operation of vertical field-effect transistor 10, 10a, 10b. A gate electrode 22 contacts p-GaN-layer 17. In drift region 12, a shielding structure 18 of p-type conductivity may be formed, for example, a heavily p-doped layer 18, in order to shield the groove with respect to the high electric fields occurring in the blocking case. Shielding structure 18 may be electroconductively connected to source-drain electrode 21. Shielding structure 18 may extend further in the direction of drift region 12 or into drift region 12 than III-V-heterostructure 15/16. A source electrode 21 contacts, that is, is electroconductively connected to, both the 2DEG as well as first semiconductor layer 13 and (optionally) shielding structure 18. A drain electrode 23 is located on the back of substrate 11.

In addition, vertical field-effect transistor 10, 10a, 10b has a contact structure 24 at least partially on or over drift region 12, which forms a Schottky- or hetero-contact at least with drift region 12. In various specific embodiments, contact structure 24 is part of a Schottky diode (see FIG. 2 to FIG. 6). Alternatively, contact structure 24 is part of a hetero-diode (see FIG. 7 and FIG. 8), for example, has or is formed from polysilicon. Contact structure 24 is electroconductively connected to source-drain electrode 21. At least the region lying vertically between contact structure 24 and drift region 12 is free of first semiconductor layer 13 and second semiconductor layer 14.

Figure 7:
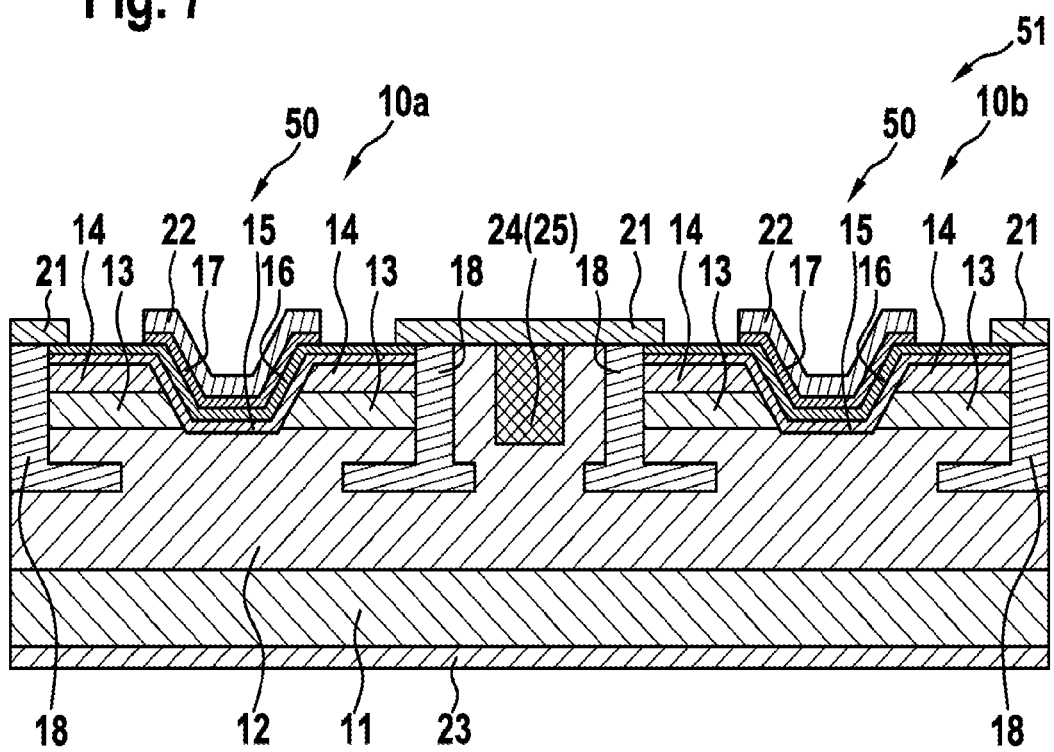

Contact structure 24 may be formed on III-V-heterostructure 15/16, as illustrated in FIG. 2 to FIG. 4 and FIG. 8. Alternatively, contact structure 24 may be formed directly on drift region 12, as illustrated in FIG. 5 to FIG. 7. Contact structure 24 may be formed over the bottom (see FIG. 2 and FIG. 3) and/or one of the first and second side walls (see FIG. 3) on III-V-heterostructure 15/16.

In addition, vertical field-effect transistor 10 may have an insulating layer 31 on or over III-V-heterostructure 15/16.

Figure 8:
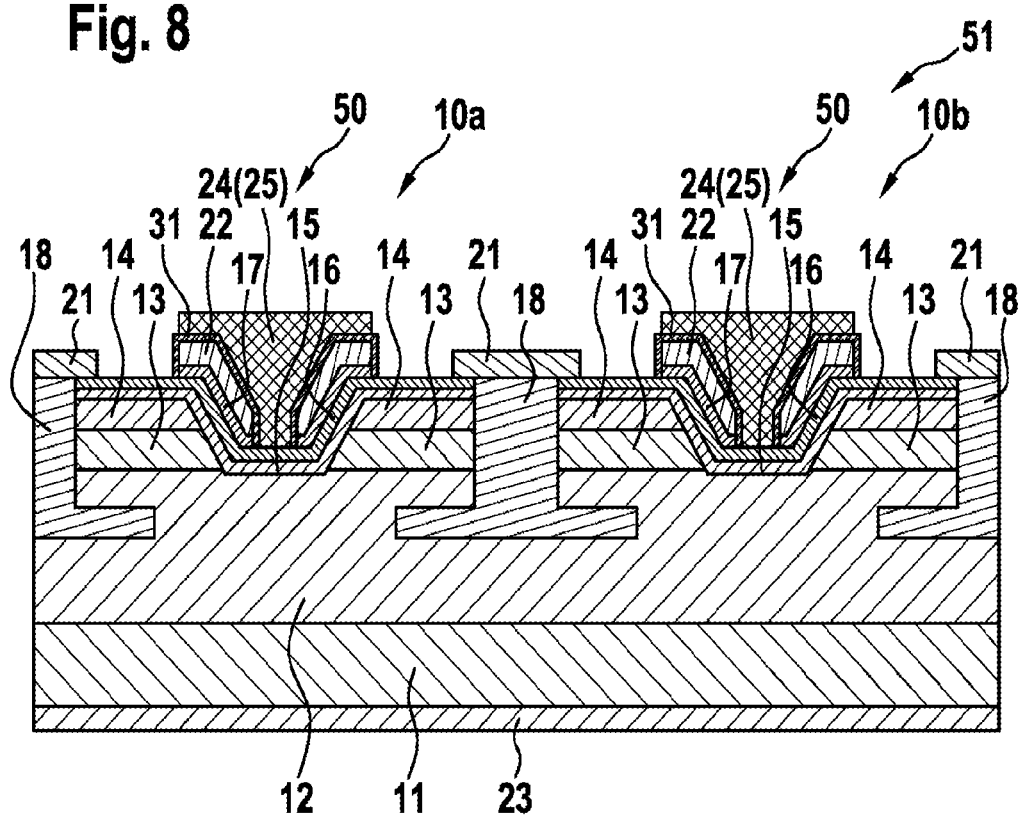

Insulating layer 31 may be formed between contact structure 24 and gate electrode 22 (see FIG. 8).

Alternatively, contact structure 24 may be formed laterally next to groove structure 50 (see FIG. 4 to FIG. 7).

For example, contact structure 24 may be formed laterally between groove structure 50 and shielding structure 18 (see FIG. 6).

Alternatively, contact structure 24 may be located outside of FET cell 10 (see FIG. 4, FIG. 5 or FIG. 7), for instance, laterally between the shielding structures of adjacent vertical field-effect transistors 10a, 10b. In this case, for example, component 51 has at least a first vertical field-effect transistor 10a and a second vertical field-effect transistor 10b. First and second vertical field-effect transistors 10a, 10b each have: A first semiconductor layer 13, which has a p-type conductivity, on or over a drift region 12; a second semiconductor layer 14, which is electrically insulating, on first semiconductor layer 13; a groove structure 50 which penetrates first semiconductor layer 13 and second semiconductor layer 14 vertically, groove structure 50 having at least one side wall on which a field-effect transistor (FET)-channel region is formed, the FET-channel region having a III-V-heterostructure 15/16 for forming a two-dimensional electron gas at an interface of III-V-heterostructure 15/16; and a source-drain electrode 21 which is electroconductively connected to III-V-heterostructure 15/16. Component 51 also has a contact structure 24 at least partially on or over drift region 12, contact structure 24 being formed laterally between groove structure 50 of first vertical field-effect transistor 10a and groove structure 50 of second vertical field-effect transistor 10b and being electroconductively connected to source-drain electrode 21 of at least one of first and second vertical field-effect transistors 10a, 10b (e.g., to source-drain electrode 21 of both). At least the region lying vertically between contact structure 24 and drift region 12 is free of first semiconductor layer 13 and second semiconductor layer 14. Moreover, first and second vertical field-effect transistors 10a, 10b may in each case have a shielding structure 18 which has a p-type conductivity and is electroconductively connected to source-drain electrode 21 of corresponding vertical field-effect transistor 10a, 10b. Shielding structure 18 may extend further in the direction of drift region 12 or into drift region 12 than III-V-heterostructure 15/16 of corresponding vertical field-effect transistor 10. Contact structure 24 may be formed laterally between shielding structure 18 of first vertical field-effect transistor 10a and shielding structure 18 of second vertical field-effect transistor 10b (see FIG. 4, FIG. 5 or FIG. 7).

Groove structure 50 may have a strip form or hexagonal form in a longitudinal direction, perpendicular to the vertical direction. Contact structure 24 may have a pillar-type cross-sectional form in the longitudinal direction (see FIG. 9). Alternatively, contact structure 24 may have a strip form that extends laterally over the width of vertical field-effect transistor 10 (see FIG. 10).

Without application of a gate voltage and positive polarity of the drain electrode relative to source electrode 21, vertical field-effect transistor 10, 10a, 10b is normally-off, since the 2DEG below p-doped layer 17 is depleted. By applying a positive voltage to gate electrode 22, the entire 2DEG becomes filled with electrons, and the electrons flow from source electrode 21 over the side wall of the gate groove into the bottom of the groove and from there into drift region 12, via substrate 11 into drain electrode 23.

Figure 2:
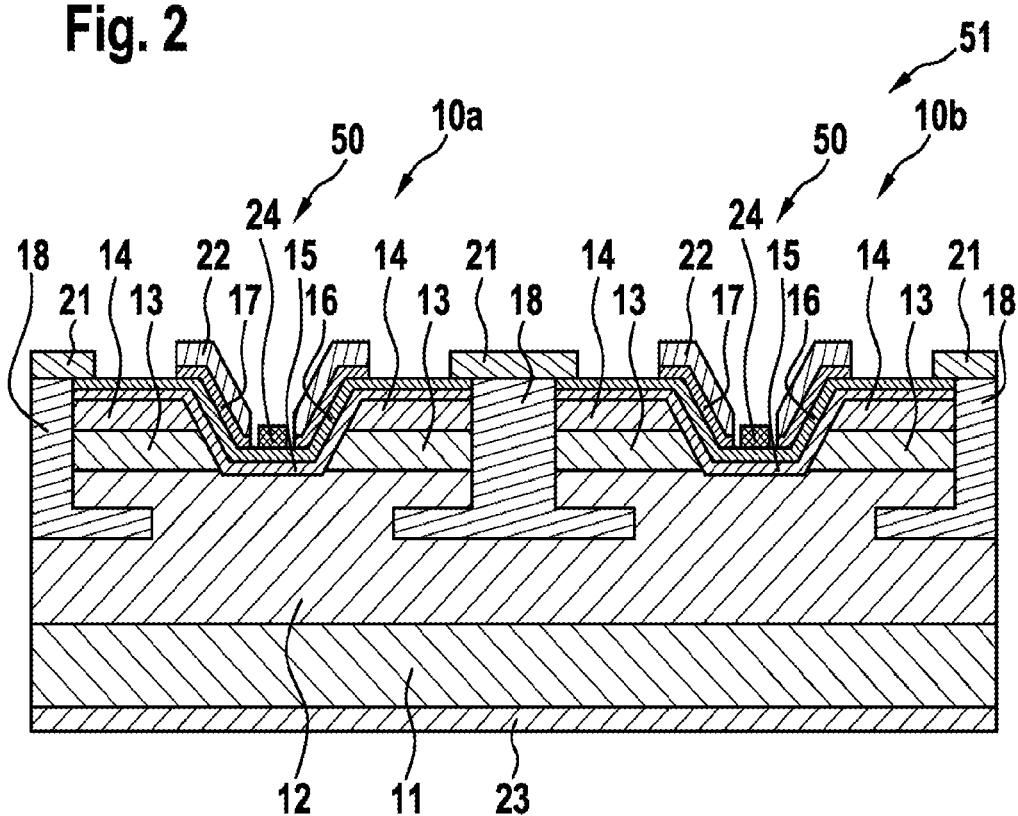

Illustratively, in the specific embodiment shown in FIG. 2, gate electrode 22 as well as p-doped GaN-layer 17 lying underneath it are interrupted in the bottom of the groove, and contact structure 24, which forms a Schottky contact with III-V heterostructure 15/16 and/or drift region 12, is incorporated in the bottom. In this case, in reverse operation, the electrons flow from drain electrode 23 through substrate 11, drift region 12 and III-V-heterostructure 15+16 to contact structure 24. Contact structure 24 is connected electrically to source electrode 21. This connection may be provided locally in each FET cell of component 51 or in a separate region within FET 10, 10a, 10b. Alternatively, III-V-heterostructure 15+16 below contact structure 24 may be eliminated. This may be of advantage for the Schottky contact (not illustrated). In this case, contact structure 24 is located directly on drift region 12.

Figure 3:
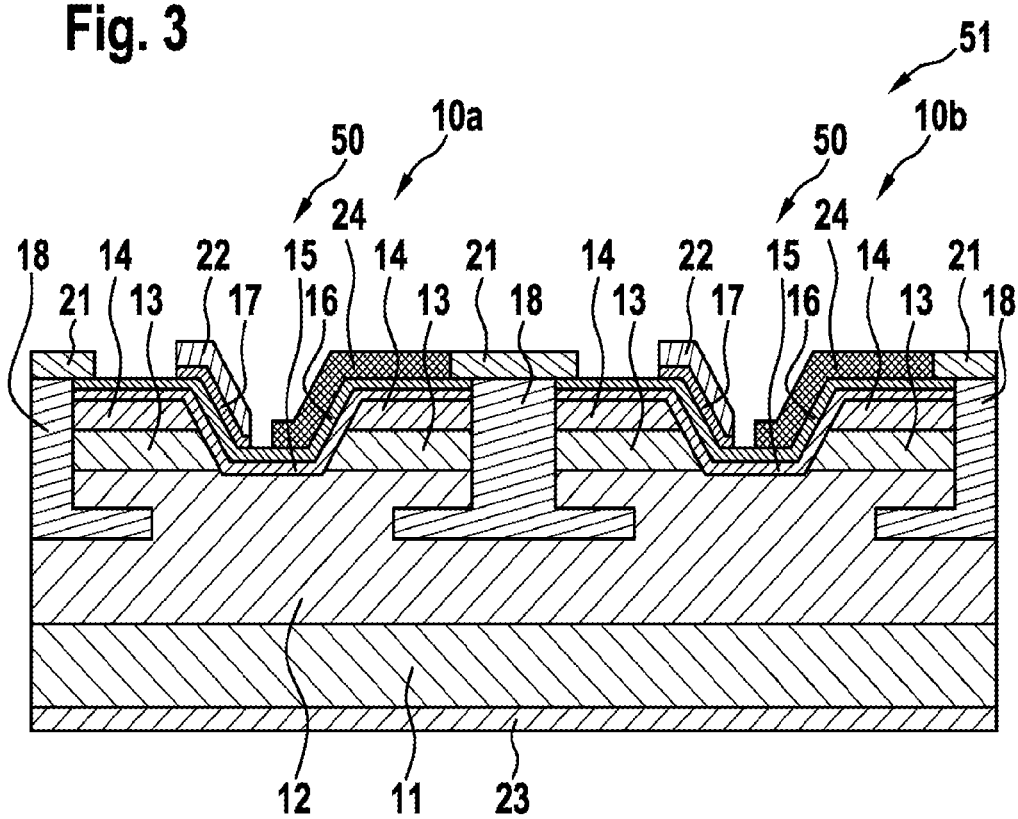

In the specific embodiment illustrated in FIG. 3, contact structure 24 is implemented not only in the bottom of the groove, but also over one side wall. This results in a markedly larger contact surface and therefore a decrease in the resistance of the body diode. In addition, the channel resistance increases, since the channel is formed only on one side wall of the groove structure. This specific embodiment is advantageous for applications which require particularly low losses in reverse operation. Moreover, in comparison to the specific embodiment in FIG. 2, for example, this specific embodiment may place lower demands on the lithography, since contact structure 24 is no longer incorporated into an interrupt of layer 17 and of gate electrode 22. Contact structure 24 only needs to be aligned precisely in one direction. This may reduce the cost of production considerably. The region below contact structure 24 may be free of III-V-heterostructure 15/16 in this specific embodiment, as well.

In the specific embodiment illustrated in FIG. 4, contact structure 24 is located outside of FET cell 10a, 10b, for example, between two directly adjacent FET cells 10a and 10b. This may further reduce the cost of production. Shielding structure(s) 18 shield contact structure 24 against electric fields in the blocking case in this specific embodiment, as well. The lithographic requirements are lower due to the positioning of contact structure 24 outside of FET cells 10a, 10b. In addition, the pitch of component 51 increases, whereby the maximum current density in forward operation is increased. In this case, first and second semiconductor layers 13, 14 are interrupted under contact structure 24, in order to permit a flow of current in reverse operation through contact structure 24, e.g., the Schottky contact. This interrupt may be implemented, for example, by placing contact structure 24 in the bottom of a trench which penetrates first and second semiconductor layers 13, 14 and III-V-heterostructure 15/16, as illustrated in FIG. 5. Alternatively, the trench, which surrounds contact structure 24, may also be incorporated within an FET cell (see FIG. 6). Potential materials for contact structure 24 may be applied by sputtering, thermal evaporation and/or electron-beam evaporation. As an alternative to the Schottky contact and corresponding to a Schottky diode as body diode, contact structure 24 may realize a semiconductor-heterojunction, e.g., utilizing a contact structure 24 formed from or having polysilicon 25 (see FIG. 7). Due to the conformal deposition of polysilicon 25, e.g., from the chemical gas phase, it is possible to completely fill a trench with polysilicon 25. At the upper edge of the trench, polysilicon 25 may easily be connected to the source potential with the aid of source electrode 21. At the transition from polysilicon 25 to drift region 12, e.g., n-GaN drift region, an energetic barrier is able to form which is higher than for typical Schottky contacts, but less than in the case of a p-n junction. Thus, forward voltages of approximately 1.2 V to approximately 1.8 V may occur in reverse operation of component 51. Alternatively, the body diode may also be implemented with polysilicon 25 within the gate groove, as illustrated in FIG. 8. In this case, polysilicon contact structure 24 (25) is electrically insulated from gate electrode 22 and p-GaN-layer 17 by insulating layer 31. Within component 51, the cross-sectional structures illustrated in FIG. 2 through FIG. 8 may be continued as strip form or hexagonal form in the longitudinal direction (in the drawing plane) perpendicular to the sectional view. In this strip form or hexagonal form, it is optional, that is, not absolutely necessary, that every section of every FET cell in the longitudinal direction have a body-diode-contact structure 24. It may be sufficient to provide corresponding body-diode-contact structures 24 in individual sections. In the top view in FIG. 9, a specific embodiment is shown in strip form in which body-diode-contact structures 24 are incorporated both in the gate groove as well as sectionally, instead of the shielding structure. It is also possible to implement body-diode-contact structure 24 sectionally in the longitudinal direction over the entire width of an FET cell, as illustrated in FIG. 10. In this case, FET cells which have no body-diode-contact structure 24 alternate in the longitudinal direction with FET cells which have body-diode-contact structure 24 exclusively, and in which, for example, first and second semiconductor layers 13, 14, III-V-heterostructure 15/16 and layer 17 were at least partially or completely eliminated. Demands on the lithographic processes may thereby be reduced.

FIG. 11 shows a flowchart of a method 200 for producing a vertical field-effect transistor according to various specific embodiments. Method 200 features: Forming 210 a first semiconductor layer 13, which has a p-type conductivity, on or over a drift region 12; forming 230 a groove structure 50 which penetrates first semiconductor layer 13 vertically, groove structure 50 being formed with at least one side wall on which a field-effect transistor (FET)-channel region is formed, the FET-channel region having a III-V-heterostructure 15/16 for forming a two-dimensional electron gas at an interface of III-V-heterostructure 15/16; and forming 240 a source-drain electrode 21 which is electroconductively connected to III-V-heterostructure 15/16; and forming 250 a contact structure 24, 25 at least partially on or over drift region 12, which forms a Schottky- or hetero-contact at least with drift region 12, contact structure 24 being electroconductively connected to source-drain electrode 21, and at least the region lying vertically between contact structure 24, 25 and drift region 12 remaining free of first semiconductor layer 13.

Optionally, a second semiconductor layer 14, which is electrically insulating, may be formed on first semiconductor layer 13 (step 220). Groove structure 50 may penetrate first semiconductor layer 13 and second semiconductor layer 14 vertically. At least the region lying vertically between contact structure 24, 25 and drift region 12 may be free of first semiconductor layer 13 and second semiconductor layer 14.

The specific embodiments described and shown in the figures are selected only by way of example. Different specific embodiments may be combined with each other completely or in terms of individual features. One specific embodiment may also be supplemented by features of another specific embodiment. In addition, method steps described may be carried out repeatedly as well as in a sequence other than the one described. In particular, the present invention is not restricted to the method indicated.

What is claimed is:

1. A vertical field-effect transistor, comprising:
   a first semiconductor layer, which has a p-type conductivity, situated on or over a drift region;
   a groove structure which penetrates the first semiconductor layer vertically, the groove structure having at least one side wall on which a field-effect transistor (FET)-channel region is formed, the FET-channel region having a III-V-heterostructure for forming a two-dimensional electron gas at an interface of the III-V-heterostructure;
   a source-drain electrode, which is electroconductively connected to the III-V-heterostructure; and
   a contact structure at least partially on or over the drift region, which forms a Schottky- or hetero-contact at least with the drift region, the contact structure being electroconductively connected to the source-drain electrode
   wherein at least a region lying vertically between the contact structure and the drift region is free of the first semiconductor layer.

2. The vertical field-effect transistor as recited in claim 1, wherein the contact structure is formed on the III-V-heterostructure.

3. The vertical field-effect transistor as recited in claim 1, wherein the contact structure is formed directly on the drift region.

4. The vertical field-effect transistor as recited in claim 1, wherein the contact structure is formed laterally next to the groove structure.

5. The vertical field-effect transistor as recited in claim 1, further comprising:
   a shielding structure which has a p-type conductivity, the shielding structure being electroconductively connected to the source-drain electrode, and the shielding structure extending further in a direction of the drift region or into the drift region than the III-V-heterostructure; and
   wherein the contact structure is formed laterally between the groove structure and the shielding structure.

6. The vertical field-effect transistor as recited in claim 1, wherein the groove structure has a first side wall and a second side wall which encompass a bottom, the contact structure being formed over the bottom and/or one of the first and second side walls on the III-V-heterostructure.

7. The vertical field-effect transistor as recited in claim 6, further comprising an insulating layer and a gate electrode on or over the III-V-heterostructure, the insulating layer being formed between the contact structure and the gate electrode.

8. The vertical field-effect transistor as recited in claim 1, wherein:
the groove structure has a strip form or hexagonal form in a longitudinal direction, perpendicular to a vertical direction, and the contact structure has a pillar-type cross-sectional form in a longitudinal direction; or
the contact structure has a strip form that extends laterally over a width of the vertical field-effect transistor.

9. The vertical field-effect transistor as recited in claim 1, wherein: (i) the contact structure is part of a Schottky diode, or (ii) the contact structure is part of a hetero diode and includes polysilicon.

10. The vertical field-effect transistor as recited in claim 1, further comprising:
a second semiconductor layer, which is electrically insulating, on the first semiconductor layer, the groove structure penetrating the first semiconductor layer and the second semiconductor layer vertically, and at least the region lying vertically between the contact structure and the drift region being free of the first semiconductor layer and the second semiconductor layer.

11. A component, comprising:
a first vertical field-effect transistor and a second vertical field-effect transistor, each of which including:
a first semiconductor layer, which has a p-type conductivity, on or over a drift region,
a groove structure which penetrates the first semiconductor layer vertically, the groove structure having at least one side wall on which a field-effect transistor (FET)-channel region is formed, the FET-channel region having a III-V-heterostructure for forming a two-dimensional electron gas at an interface of the III-V-heterostructure, and
a source-drain electrode, which is electroconductively connected to the III-V-heterostructure;
a contact structure at least partially on or over the drift region, the contact structure being formed laterally between the groove structure of the first vertical field-effect transistor and the groove structure of the second vertical field-effect transistor and being electroconductively connected to the source-drain electrode of at least one of the first and second vertical field-effect transistors, at least a region lying vertically between the contact structure and the drift region being free of the first semiconductor layer.

12. The component as recited in claim 11, wherein each vertical field-effect transistor of the first and second vertical field-effect transistors has a shielding structure which has a p-type conductivity and is electroconductively connected to the source-drain electrode of the vertical field-effect transistor, the shielding structure extending further in the direction of the drift region or into the drift region than the III-V-heterostructure of the vertical field-effect transistor, and wherein the contact structure is formed laterally between the shielding structure of the first vertical field-effect transistor and the shielding structure of the second vertical field-effect transistor.

13. A method for producing a vertical field-effect transistor, the method comprising:
forming a first semiconductor layer, which has a p-type conductivity, on or over a drift region;
forming a groove structure which penetrates the first semiconductor layer vertically, the groove structure being formed with at least one side wall on which a field-effect transistor (FET)-channel region is formed, the FET-channel region having a III-V-heterostructure for forming a two-dimensional electron gas at an interface of the III-V-heterostructure;
forming a source-drain electrode, which is electroconductively connected to the III-V-heterostructure; and
forming a contact structure at least partially on or over the drift region, which forms a Schottky- or hetero-contact at least with the drift region, the contact structure being electroconductively connected to the source-drain electrode;
wherein at least a region lying vertically between the contact structure and the drift region remaining free of the first semiconductor layer.

* * * * *